US011170806B2

(12) United States Patent
Zheng et al.

(10) Patent No.: US 11,170,806 B2
(45) Date of Patent: Nov. 9, 2021

(54) MAGNETIC SENSOR ARRAY WITH SINGLE TMR FILM PLUS LASER ANNEALING AND CHARACTERIZATION

(71) Applicant: Western Digital Technologies, Inc., San Jose, CA (US)

(72) Inventors: Yuankai Zheng, Fremont, CA (US); Ming Mao, Dublin, CA (US); Daniele Mauri, San Jose, CA (US); Chih-Ching Hu, Pleasanton, CA (US); Chen-Jung Chien, Mountain View, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/879,601

(22) Filed: May 20, 2020

(65) Prior Publication Data
US 2021/0201943 A1    Jul. 1, 2021

Related U.S. Application Data

(60) Provisional application No. 62/954,199, filed on Dec. 27, 2019.

(51) Int. Cl.
*G11B 5/39* (2006.01)
*G01R 33/09* (2006.01)
(Continued)

(52) U.S. Cl.
CPC .......... *G11B 5/3909* (2013.01); *G01R 33/098* (2013.01); *G11B 5/3163* (2013.01); *H01L 43/08* (2013.01); *H01L 43/12* (2013.01)

(58) Field of Classification Search
None
See application file for complete search history.

(56) References Cited

U.S. PATENT DOCUMENTS 6,882,145 B2 * 4/2005 Ehresmann ............ B82Y 25/00
324/252
7,629,789 B2  12/2009 Paul et al.
(Continued)

FOREIGN PATENT DOCUMENTS

CN        102460575 A      5/2012
CN        104103753 B      9/2017
(Continued)

OTHER PUBLICATIONS

Worledge, D.C. et al., "Magnetoresistance Measurement of Unpatterned Magnetic Tunnel Junction Wafers by Current-in-Plane Tunneling"; Applied Physics Letters, vol. 83, No. 1, Jul. 7, 2003 (4 pages).
(Continued)

*Primary Examiner* — William J Klimowicz
(74) *Attorney, Agent, or Firm* — Patterson & Sheridan, LLP; Steven H. Versteeg

(57) ABSTRACT

The present disclosure generally relates to a Wheatstone bridge array that has four resistors. Each resistor includes a plurality of TMR films. Each resistor has identical TMR films. The TMR films of two resistors have reference layers that have an antiparallel magnetic orientation relative to the TMR films of the other two resistors. To ensure the antiparallel magnetic orientation, the TMR films are all formed simultaneously and annealed in a magnetic field simultaneously. Thereafter, the TMR films of two resistors are annealed a second time in a magnetic field while the TMR films of the other two resistors are not annealed a second time.

18 Claims, 11 Drawing Sheets

(51) Int. Cl.
  *H01L 43/12* (2006.01)
  *H01L 43/08* (2006.01)
  *G11B 5/31* (2006.01)

(56) References Cited

U.S. PATENT DOCUMENTS

| | | |
|---|---|---|
| 8,884,616 B2 | 11/2014 | Zimmer et al. |
| 9,069,033 B2 | 6/2015 | Chen et al. |
| 9,147,408 B1 | 9/2015 | Zheng et al. |
| 9,316,706 B2 * | 4/2016 | Granig ............... G01R 33/0047 |
| 9,722,175 B2 | 8/2017 | Lei et al. |
| 2011/0025319 A1* | 2/2011 | Saruki ............... G01R 33/0029 324/252 |
| 2012/0068698 A1 | 3/2012 | Chen et al. |
| 2017/0123016 A1 | 5/2017 | Deak |
| 2018/0113179 A1 | 4/2018 | Deak et al. |
| 2018/0356474 A1* | 12/2018 | Hammerschmidt . G01R 33/093 |
| 2019/0368858 A1 | 12/2019 | Deak et al. |
| 2020/0132786 A1* | 4/2020 | Takano ............... H01F 10/3295 |
| 2020/0158794 A1* | 5/2020 | Cai ..................... G01R 33/0023 |

FOREIGN PATENT DOCUMENTS

| | | | | |
|---|---|---|---|---|
| JP | 5138204 B2 * | 2/2013 | ........... | G01R 33/093 |
| WO | WO-0194963 A2 * | 12/2001 | ............. | B82Y 25/00 |
| WO | WO-2020121108 A1 * | 6/2020 | ........... | G01R 33/098 |

OTHER PUBLICATIONS

Sharma, A. et al, "Exchange Bias and Diffusion Processes in Laser Annealed CoFeB/IrMn Thin Films", Elsevier, Journal of Magnetism and Magnetic Materials, 489, 165390, 2019, (5 pages).

International Search Report and Written Opinion issued in corresponding International Patent Application No. PCT/US2020/036318, dated Dec. 21, 2020 (11 pages).

* cited by examiner

MAGNETIC SENSOR ARRAY WITH SINGLE TMR FILM PLUS LASER ANNEALING AND CHARACTERIZATION

CROSS-REFERENCE TO RELATED APPLICATIONS

This application claims benefit of U.S. Provisional Patent Application Ser. No. 62/954,199, filed Dec. 27, 2019, which is herein incorporated by reference.

BACKGROUND OF THE DISCLOSURE

Field of the Disclosure

Embodiments of the present disclosure generally relate to a Wheatstone bridge array and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as a magnetic sensors. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has a very high sensitivity compared to other magnetic sensors.

The Wheatstone bridge array has a linear output signal and resists the environment temperature. Any temperature change in the Wheatstone bridge array is cancelled. The Wheatstone bridge array has four resistors. Two of the resistors have identical resistance while the remaining two resistors have identical resistances relative to each other, but different from the original two resistors.

Fabricating different resistors to achieve different resistances can be costly and time consuming. Therefore, there is a need in the art for a Wheatstone bridge array that can be fabricated in a cost effective and time sensitive manner.

SUMMARY OF THE DISCLOSURE

The present disclosure generally relates to a Wheatstone bridge array that has four resistors. Each resistor includes a plurality of TMR films. Each resistor has identical TMR films. The TMR films of two resistors have reference layers that have an antiparallel magnetic orientation relative to the TMR films of the other two resistors. To ensure the antiparallel magnetic orientation, the TMR films are all formed simultaneously and annealed in a magnetic field simultaneously. Thereafter, the TMR films of two resistors are annealed a second time in a magnetic field while the TMR films of the other two resistors are not annealed a second time.

In one embodiment, a TMR sensor device comprises: a first resistor comprising at least one first tunnel magnetoresistive (TMR) film having a first reference layer; and a second resistor comprising at least one second TMR film having a second reference layer, wherein the first TMR film and the second TMR film are substantially identical, and wherein the first reference layer and the second reference layer have an antiparallel magnetic orientation.

In another embodiment, a TMR sensor device comprises four resistors, wherein each resistor includes at least one tunnel magnetoresistive (TMR) film that includes a reference layer, wherein the TMR films are identical in each resistor, and wherein the reference layer of at least two TMR films have an antiparallel magnetic orientation.

In another embodiment, a method of manufacturing a TMR sensor device comprises: forming a first tunnel magnetoresistive (TMR) film on a substrate; forming a second TMR film on the substrate; annealing the first TMR film and the second TMR film in a magnetic field; and annealing the second TMR film a second time in a magnetic field.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a Wheatstone bridge array that has four resistors. Each resistor includes a plurality of TMR films. Each resistor has identical TMR films. The TMR films of two resistors have reference layers that have an antiparallel magnetic orientation relative to the TMR films of the other two resistors. To ensure the antiparallel magnetic orientation, the TMR films are all formed simultaneously and annealed in a magnetic field simultaneously. Thereafter, the TMR films of two resistors are annealed a second time in a magnetic field while the TMR films of the other two resistors are not annealed a second time.

Figure 1:
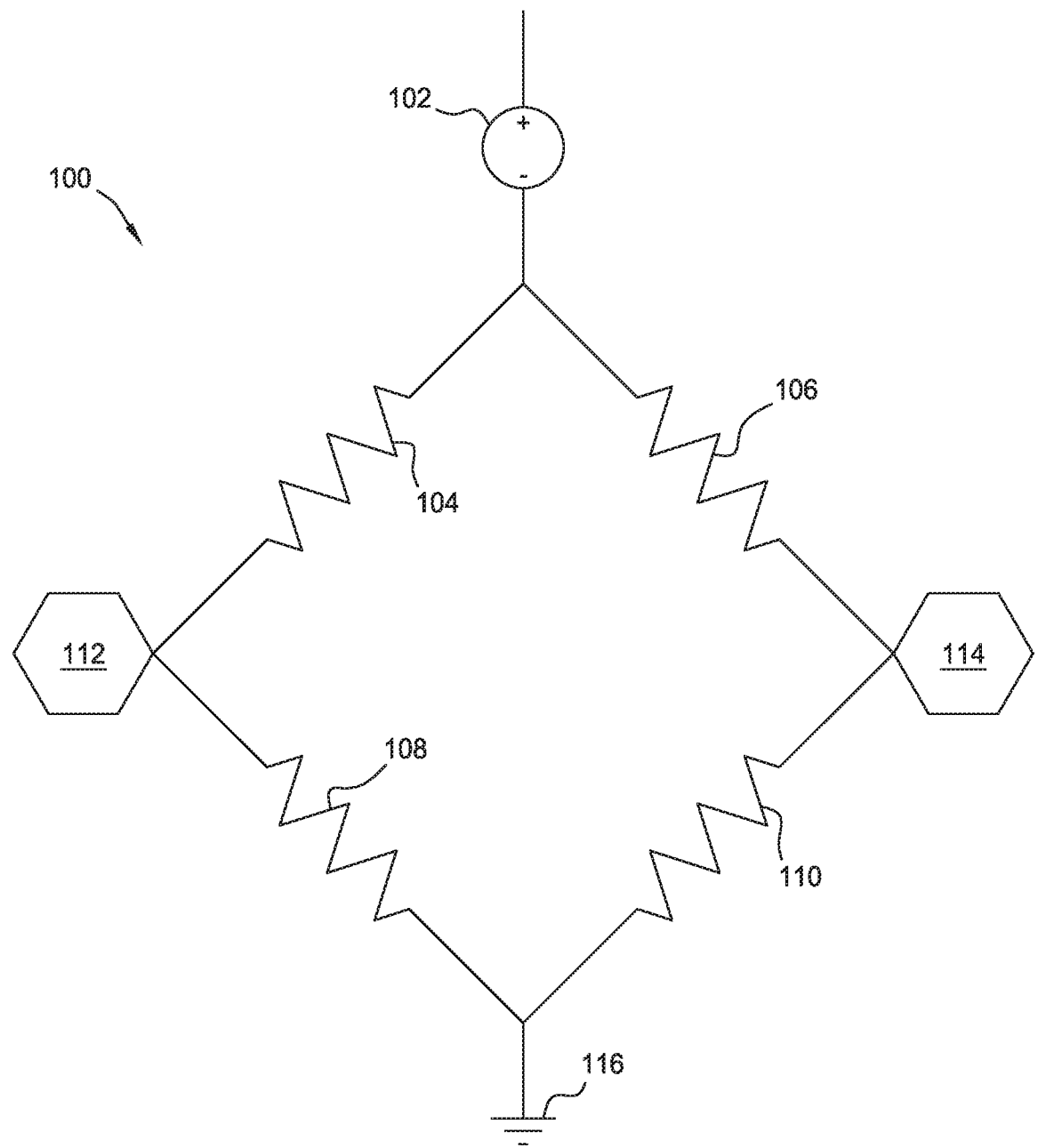
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first sensor 112, a second sensor 114, and a ground connection 116. Bias voltage is applied across the array from the bias source 102 to the ground connection 116. The first sensor 112 and the second sensor 114 sense the output of the applied voltage. Any temperature change from the resistors 104, 106, 108, 110 can be cancelled.

As discussed herein, the resistors 104, 106, 108, 110 each include a TMR sensor. In one embodiment, the TMR sensors are each distinct and different such that the resistors 104, 106, 108, 110 have different resistance. In another embodiment, the TMR sensors are identical, but the resistors 104, 106, 108, 110 are different. In still another embodiment, resistors 104, 110 are identical to each other (as are the TMR sensors that comprise the resistors 104, 110), and resistors 106, 108 are identical to each other (as are the TMR sensors that comprise the resistors 106, 108) yet different from resistors 104, 110. For a TMR sensor in array 100, the RA for the array 100 is around 100 Ohms microns$^2$.

Typical magnetic field sensors use MR (magnetoresistance) devices in a Wheatstone bridge circuit. The sensor requires the MR devices to change differently in the bridge. As discussed herein, a new method to make a magnetic field sensor is to fabricate two different TMR films in the same layer. The reliability and performance of the TMR films determines the magnetoresistance response. In this way, combined with different TMR films features, a perfect Wheatstone bridge design for magnetic field sensor can be fabricated.

In regards to FIG. 1, if the free layer of the TMR sensors that comprises the resistors 104, 106, 108, 110 has a long axis of +45° or −45° to the pinned layer magnetization direction, then the free layer easy axis is restricted to be along the long axis due to the shape anisotropy, and the magnetization direction can be set as shown in FIG. 1 by an ampere field from the set line current, especially if on top of the free layer there is a set line orthogonal to the free layer long axis.

When applying a magnetic field along the Y-axis, resistors 110 and 104 are increasing while resistors 106, 108 are decreasing with the field. This different response enables the Wheatstone bridge, and the sensor sensitivity is proportional to the output voltage which is proportional to the difference between resistor 110 (or resistor 104) and resistor 106 (or resistor 108). However, in use only half of the magnetoresistance change is used due to the 45° free layer or pinned layer initial state. If the free layer to pinned layer initial state can be 90° and still have two different magnetoresistance change, the sensor sensitivity can be increased by a factor of two.

If the free layer and pinned layer are orthogonal, then the pinned layer magnetization direction is set by magnetic annealing direction. Usually resistors 104, 106, 108, 110 are made by the same TMR film and experience the same processes, and therefore all have the same pinned layer direction. Each device can operate in full MR ratio, but all the devices respond to the external field in the same way and consequently there is no output voltage at all. A simple way to resolve this issue is to shield resistor 106 and resistor 108 by covering with a thick NiFe film so that resistor 106 and resistor 108 will not respond to magnetic fields. Alternatively, resistors 106 and 108 can be replaced with constant resistors. However, this kind of half bridge-sensing scheme will also reduce the output voltage and therefore limits the sensitivity.

Figure 2A:
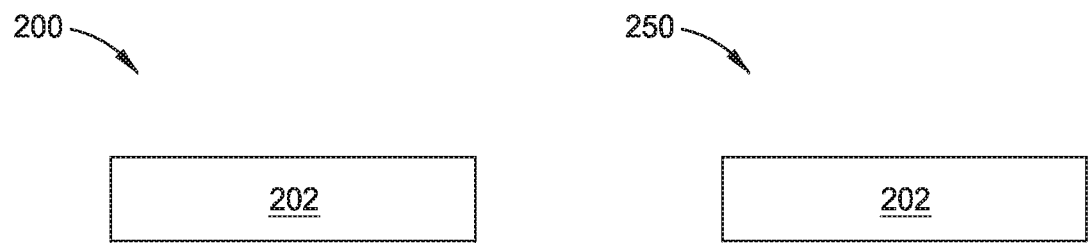
FIGS. 2A-2G are schematic illustrations of TMR structures at various stages of manufacture according to one embodiment.

FIGS. 2A-2G are schematic illustrations of TMR structures 200, 250 at various stages of manufacture according to one embodiment. As shown in FIG. 2A, each TMR structure 200, 250 includes a seed layer 202. The seed layers 202 are formed simultaneously for each TMR structure 200, 250. It is to be understood that the terms TMR structure, TMR sensor, and TMR film may be used interchangeably throughout the description. In one embodiment, the seed layer 202 comprises a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layer 202 material, other materials are contemplated and the embodiments discussed herein are not limited to ruthenium for the seed layer 202.

Figure 2B:
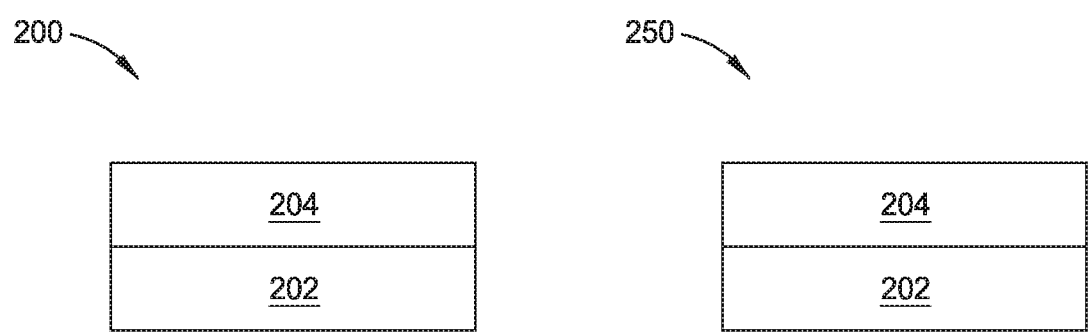

An antiferromagnetic (AFM) layer 204 is disposed on the seed layer 202 as shown in FIG. 2B. Suitable materials for the AFM layer 204 include IrMn or PtMn at a thickness of between about 40 Angstroms to about 500 Angstroms such as between about 40 Angstroms and about 100 Angstroms. The AFM layer 204 may be formed by well-known deposition methods such as sputtering. Additionally, it is to be understood that while IrMn and PtMn have been exemplified as the AFM layer 204 materials, other materials are contemplated and the embodiments discussed herein are not limited to IrMn or PtMn for the AFM layer 204.

Figure 2C:
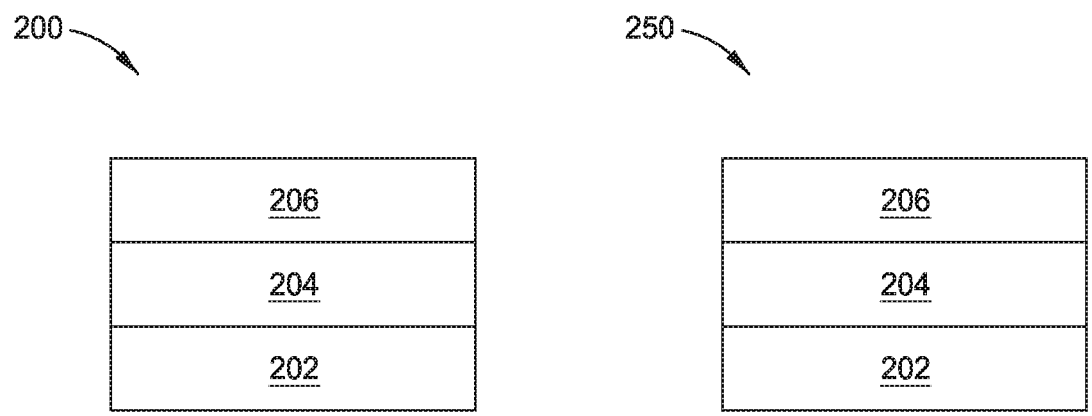

A pinned layer 206 is disposed on the AFM layer 204 as shown in FIG. 2C. Suitable materials for the pinned layer 206 include CoFe, or a Co/CoFe/Co multi-layer stack with a thickness of between about 20 Angstroms and about 30 Angstroms. The pinned layer 206 may be formed by well-known deposition methods such as sputtering. Additionally, it is to be understood that while CoFe or Co/CoFe/Co have been exemplified as the pinned layer 206 material, other materials are contemplated and the embodiments discussed herein are not limited to CoFe or Co/CoFe/Co for the pinned layer 206. The pinned layer is pinned by the AFM layer 204 and thus the magnetic moment of the pinned layer 206 will not change when an external field is applied.

Figure 2D:
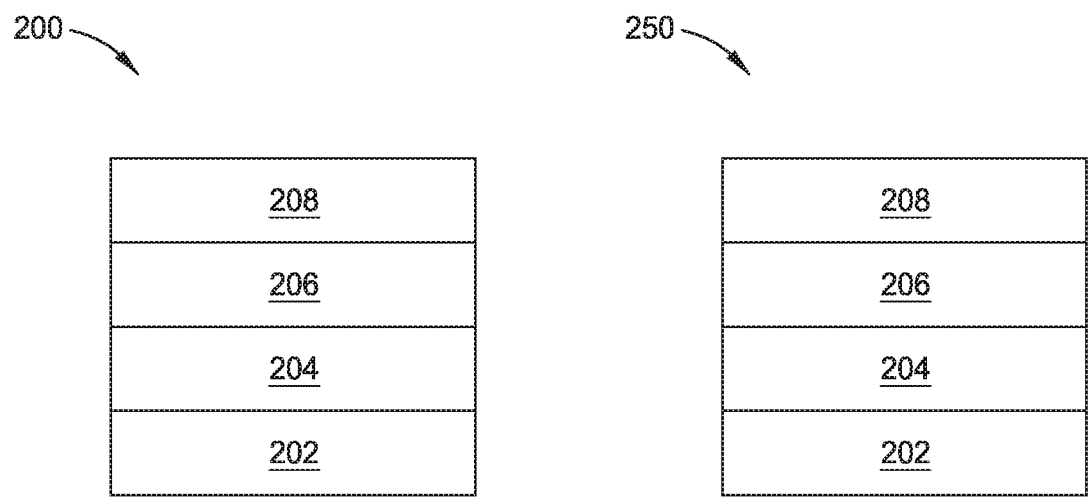

A spacer layer 208 is disposed on the pinned layer 206 as shown in FIG. 2D. Suitable materials for the spacer layer 208 includes Ru at a thickness of between about 4 Angstroms to about 10 Angstroms. The spacer layer 208 may be formed by well-known deposition methods such as sputtering. Additionally, it is to be understood that while ruthenium has been exemplified as the spacer layer 208 material, other materials are contemplated and the embodiments discussed herein are not limited to ruthenium for the spacer layer 208.

Figure 2E:
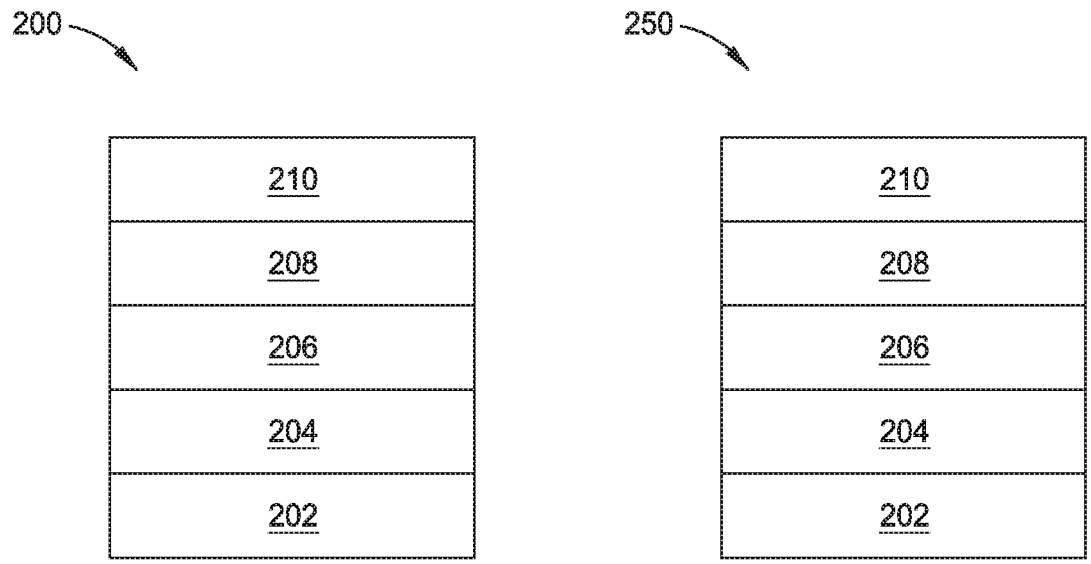

A reference layer 210 is disposed on the spacer layer 208 as shown in FIG. 2E. Suitable materials for the reference layer 210 include CoFe/Ta/CoFeB/CoFe as a multilayer stack. The first CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layer 210 may be formed by well-known deposition methods such as sputtering. Additionally, it is to be understood that while CoFe/Ta/CoFeB/CoFe has been exemplified as the reference layer 210 material, other materials are contemplated and the embodiments discussed herein are not limited to CoFe/Ta/CoFeB/CoFe for the reference layer 210. The reference layer 210 is antiferromagnetically coupled with the pinned layer 206 through the spacer layer 208 so that the magnetic moment of the reference layer 210 is also fixed.

Figure 2F:
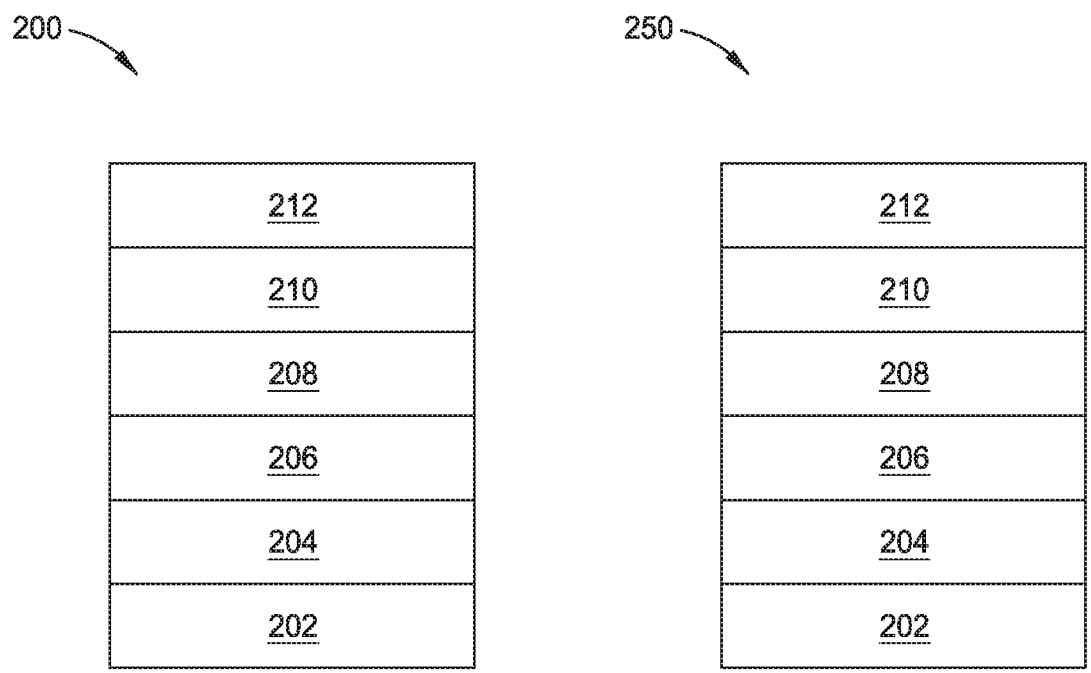

A barrier layer 212 is disposed on the reference layer 210 as shown in FIG. 2F. Suitable materials for the barrier layer 212 include MgO at a thickness of between about 10 Angstroms to about 20 Angstroms. It is to be understood that while MgO is exemplified as the barrier layer 212, other insulating materials as contemplated.

Figure 2G:
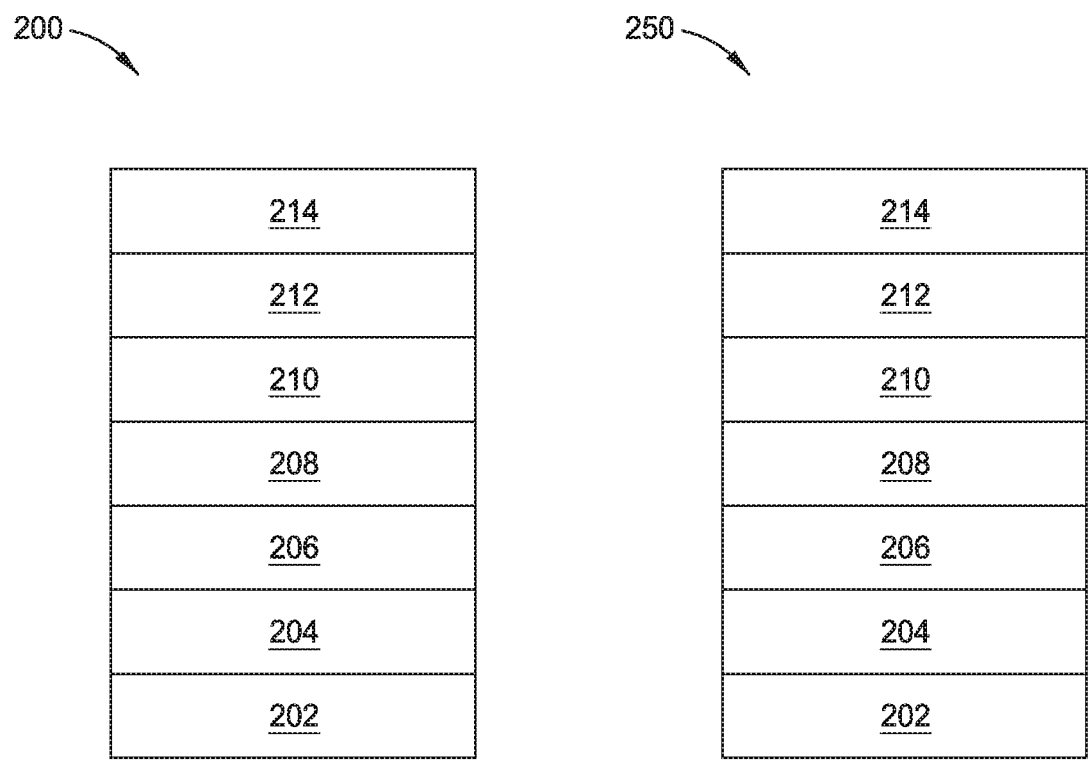

A free layer 214 is disposed on the barrier layer 212 as shown in FIG. 2G. Suitable materials for the free layer 214 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 214 may be formed by well-known deposition methods such as sputtering. Additionally, it is to be understood that while CoFe/CoFeB/Ta/NiFe has been exemplified as the free layer 214 material, other materials are contemplated and the embodiments discussed herein are not limited to CoFe/CoFeB/Ta/NiFe for the free layer 214. In operation, the free layer 214 can be slightly biased to obtain a linear signal that can rotate when an external field is applied. Capping layers may additionally be formed over the free layer 214.

Figure 3A:
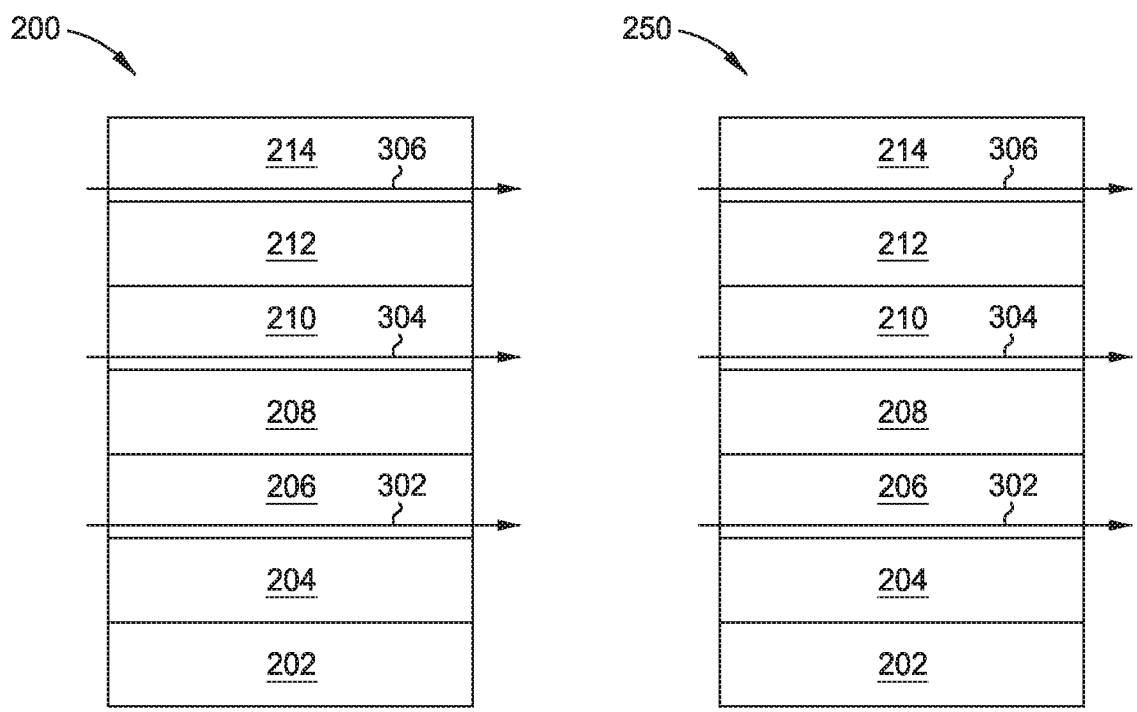
FIGS. 3A and 3B are schematic illustrations of TMR structures prior to and after the first annealing according to one embodiment.

After film deposition, the TMR films 200, 250 are annealed in vacuum with a magnetic field applied. In one embodiment, the TMR films 200, 250 are annealed in a magnetic oven at a temperature of between about 250 degrees Celsius to about 300 degrees Celsius under a magnetic field of between about 10,000 Oe to about 50,000 Oe. FIG. 3A illustrates the magnetic moments of the pinned layer 206, the reference layer 210, and the free layer 214 prior to annealing. The pinned layer 206 is pinned by the AFM layer 204 as shown by arrow 302, and the magnetic moment will not change when an external field is applied. The reference layer 210 is antiferromagnetically coupled with the pinned layer 206 through the thin spacer layer 208 as shown by arrow 304. The magnetic moment of the reference layer 210 is also fixed. The free layer 214 can be slightly biased to get the linear signal. The magnetic moment of the free layer 214 can rotate when an external field is applied as shown by arrow 306.

Figure 3B:
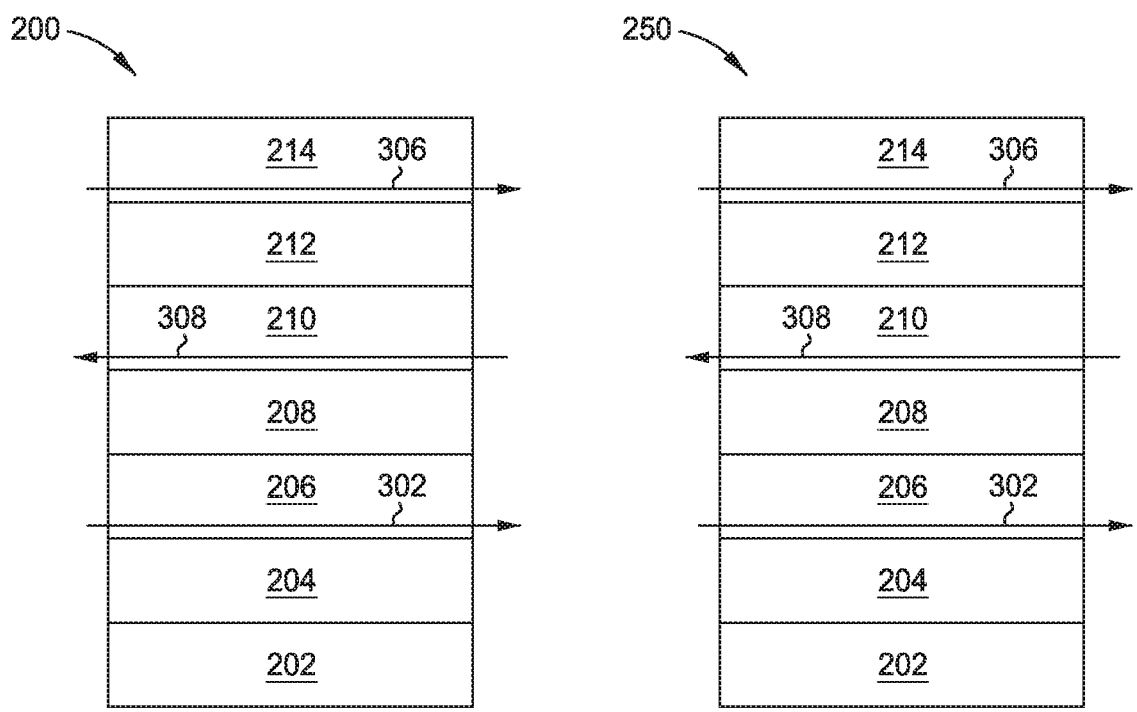

After annealing, the magnetic moment of the reference layer 210 will have flipped as shown as arrow 308 in FIG. 3B. In order to obtain two different TMR films 200, 250, a second, selective annealing process occurs in order to make the references layers 206 antiparallel to each other. For example, TMR film 250 may selectively annealed while TMR film 200 is not annealed. In such a scenario, TMR film 200 may be masked to prevent selective annealing. In one embodiment, rather than masking TMR film 200, TMR film 250 is annealed by a focused annealing treatment, such as laser annealing. It is to be understood that TMR film 200 may be selectively annealed while TMR film 250 is not annealed.

Figure 3C:
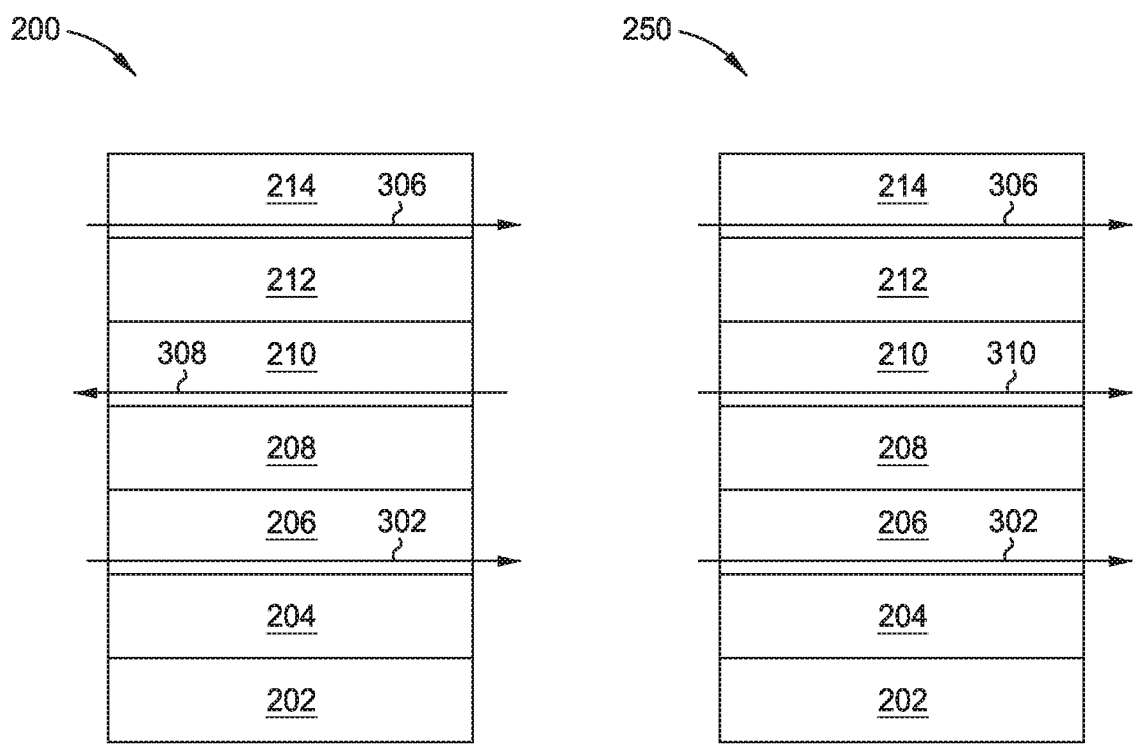
FIG. 3C is schematic illustration of TMR structures after the second annealing according to one embodiment.

To perform the second annealing, initially a film is chosen, such as TMR film 250. The TMR film 250 is selectively annealed with a laser together with an external magnetic field. In one embodiment, the laser will be a laser beam and have a size of less than 1 mm. If TMR film 250 is annealed, then TMR film 200 is not annealed in the second annealing. Thus, TMR film 250 will have the magnetic moment of the reference layer 210 flipped as shown by arrow 310 while the magnetic moment of the reference layer 210 of TMR film 200 will not flip as shown in FIG. 3C. In one embodiment, the external field applied during the second annealing is between about 3000 Oe and about 6000 Oe, and the TMR film 200 is not masked. The laser may operate at any well-known wavelength and is not limited to a particular wavelength of operation.

Figure 4:
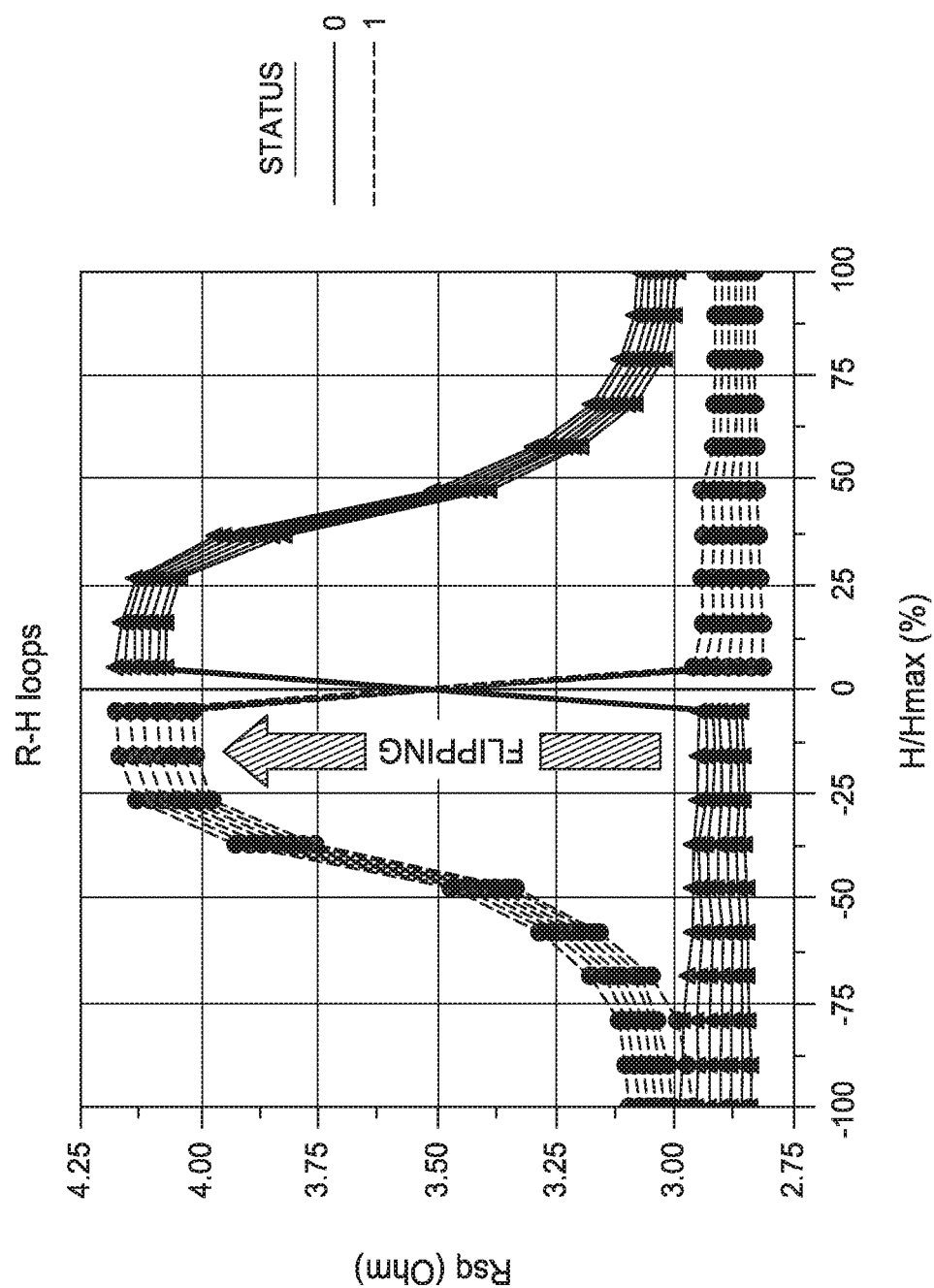
FIG. 4 is a graph illustrating the R-H curve of TMR films 200, 250 following the second annealing.
Figure 5:
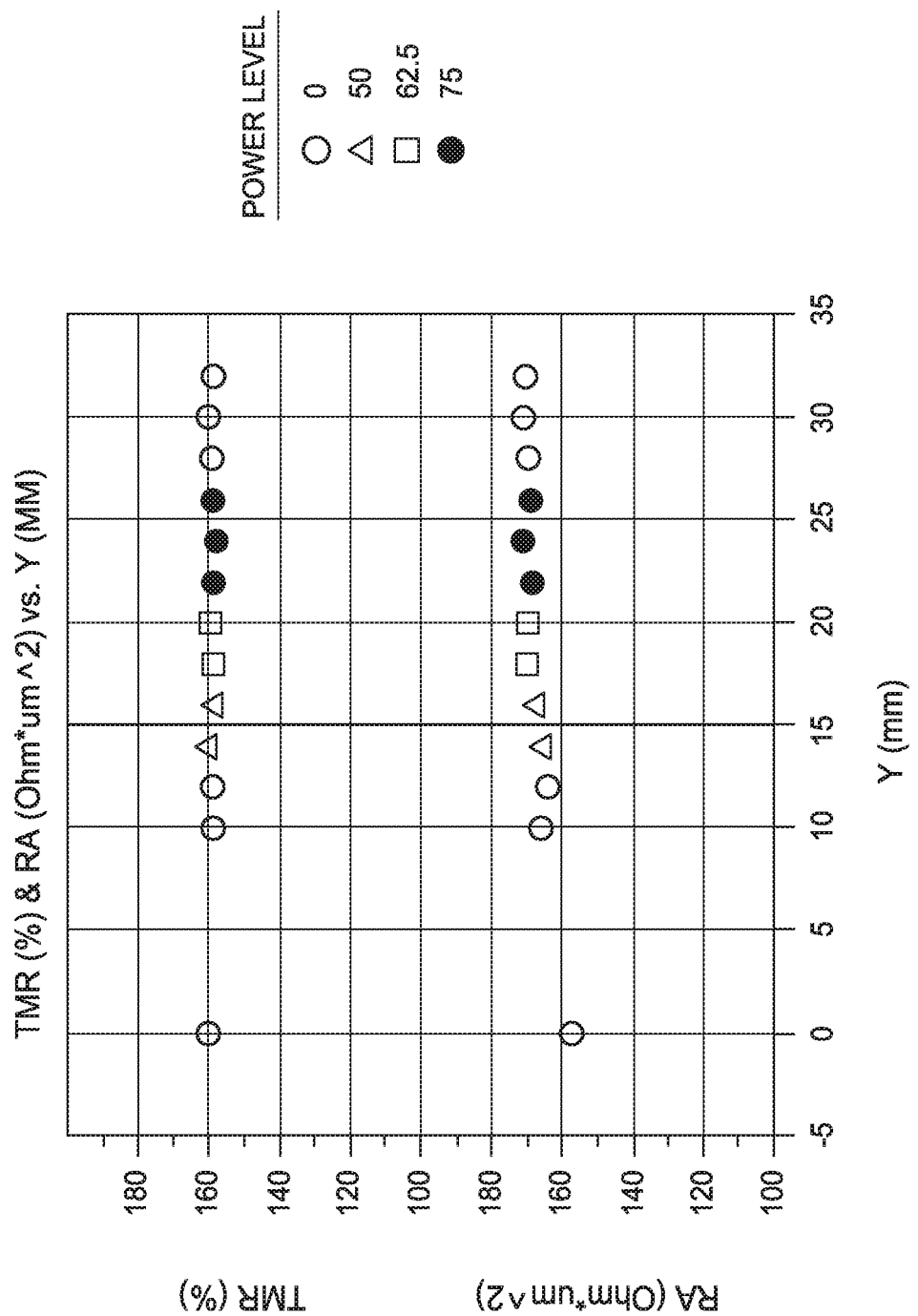
FIG. 5 is a graph illustrating the resistance area and TMR for a TMR film that has been annealed according to one embodiment.

After the second annealing, a current-in-plane tunneling (CIPT) method is used to characterize the TMR films 200, 250 to make sure the laser annealing resulted in the desired properties. FIG. 4 is a graph illustrating the R-H curve of TMR films 200, 250 following the second annealing. Because the reference layers 210 have magnetic moments in that are antiparallel (in other words, opposite magnetic direction), the TMR films 200, 250 will sense the external field differently, one with a positive slope and another with a negative slope. FIG. 5 shows the resistance area (RA) and TMR for both TMR films 200, 250. Using CIPT, the second annealing's impact is confirmed that TMR film 250 has flipped the magnetic moment of the reference layer 210 without changing the RA and TMR.

Figure 6:
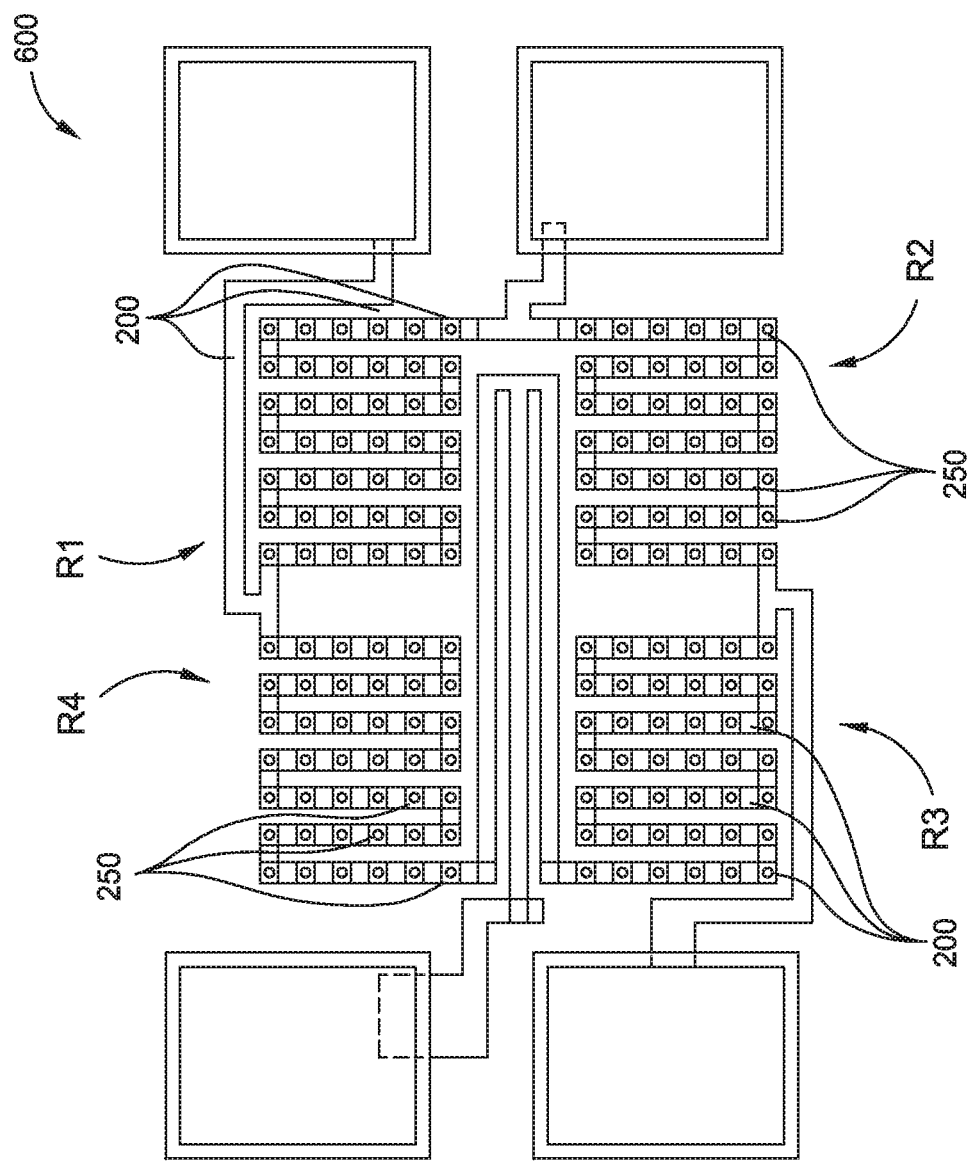
FIG. 6 is a schematic illustration of a Wheatstone bridge array with multiple TMR structures for each resistor.

FIG. 6 is a schematic illustration of a Wheatstone bridge array 600 with multiple TMR structures for each resistor R1, R2, R3, R4. R1 may correspond to resistor 104; R2 may correspond to resistor 106; R3 may correspond to resistor 110; and R4 may correspond to resistor 108. When the working field bias is set to 0, then R1=R2=R3=R4. Additionally, the resistors R1 and R3 are distinct from resistors R2 and R4 based upon the TMR structures to provide two different magnetoresistances responses.

In the array 600, each resistor R1, R2, R3, R4 includes a plurality of TMR structures 200, 250. More specifically, in one embodiment, resistors R1 and R3 will include a plurality of TMR structures 200 and resistors R2 and R4 will include a plurality of TMR structures 250. In another embodiment, resistors R1 and R3 will include a plurality of TMR structures 250 and resistors R2 and R4 will include a plurality of TMR structures 200. For simplicity, FIG. 6 illustrates resistors R1 and R3 having TMR structures 200 while resistors R2 and R4 have TMR structures 250. The TMR structures 200, 250 in resistors R1 and R3 are identical in both number and design. Similarly, the TMR structures 200, 250 in resistors R2 and R4 are identical in both number and design.

Figure 7:
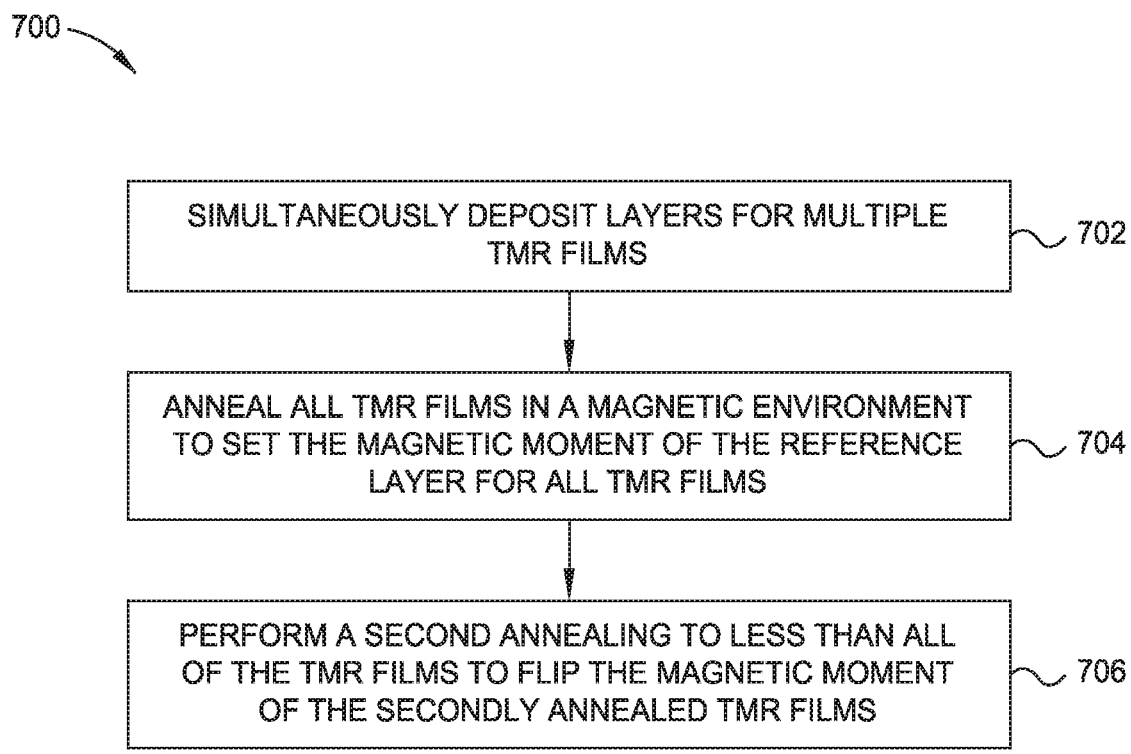
FIG. 7 is a flowchart illustrating a method of manufacturing a Wheatstone bridge array.

FIG. 7 is a flowchart illustrating a method 700 of manufacturing a Wheatstone bridge array. The method operates by initially forming multiple TMR films simultaneously in step 702. The TMR films formed simultaneously are identical. Then, the TMR films are annealed in a first annealing process to set the magnetic moment of the reference layer for each TMR film in step 704. Thereafter, less than all of the TMR films are annealed a second time to flip the magnetic moment of the secondly annealed TMR films in step 706. During the second annealing, the TMR films that are not annealed will not flip the magnetic moment of the reference layer. Thus, the resulting Wheatstone bridge array will have some TMR films with a reference layer that has a magnetic moment in a first direction while the remaining TMR films will have a reference layer that has a magnetic moment in a second direction that is opposite, and hence antiparallel, to the first direction. Forming the TMR films identically and subjecting the TMR films to the same first annealing process results in an efficiently produced Wheatstone bridge array. Furthermore, not only is there an efficiency realization in terms of time, but because the TMR films can be fabricated simultaneously, there is a cost saving as well.

In one embodiment, a TMR sensor device comprises: a first resistor comprising at least one first tunnel magnetoresistive (TMR) film having a first reference layer; and a second resistor comprising at least one second TMR film having a second reference layer, wherein the first TMR film and the second TMR film are substantially identical, and wherein the first reference layer and the second reference layer have an antiparallel magnetic orientation. The Wheatstone bridge array further comprises a third resistor comprising at least one third TMR film having a third reference layer; and a fourth resistor comprising at least one fourth TMR film having a fourth reference layer. The third TMR film and the fourth TMR film are substantially identical, and wherein the third reference layer and the fourth reference layer have an antiparallel magnetic orientation. The first TMR film, the second TMR film, the third TMR film, and the fourth TMR film are substantially identical. The first reference layer and the third reference layer have a parallel magnetic orientation, and wherein the second reference layer and the fourth reference layer have a parallel magnetic orientation. The first TMR film and the second TMR film each comprise: a seed layer; an antiferromagnetic layer disposed on the seed layer; a pinned layer disposed on the antiferromagnetic layer; a spacer layer disposed on the pinned layer; a reference layer disposed on the spacer layer, wherein the reference layer is either the first reference layer or the second reference layer; a barrier layer disposed on the reference layer; and a free layer disposed on the barrier layer. The first TMR film has an R-H curve that has a positive slope and the second TMR film has an R-H curve that has a negative slope. The first resistor and the second resistor have the same resistance area (RA).

In another embodiment, a TMR sensor device comprises four resistors, wherein each resistor includes at least one tunnel magnetoresistive (TMR) film that includes a reference layer, wherein the TMR films are identical in each resistor, and wherein the reference layer of at least two TMR films have an antiparallel magnetic orientation. Each TMR film comprises: a seed layer; an antiferromagnetic layer disposed on the seed layer; a pinned layer disposed on the antiferromagnetic layer; a spacer layer disposed on the pinned layer; the reference layer disposed on the spacer layer; a barrier layer disposed on the reference layer; and a free layer disposed on the barrier layer. The seed layer and the spacer layer comprise the same material. The seed layer and the spacer layer each comprise ruthenium. Each resistor has the same number of TMR films. Each resistor has the same resistance area (RA).

In another embodiment, a method of manufacturing a TMR sensor device comprises: forming a first tunnel magnetoresistive (TMR) film on a substrate; forming a second TMR film on the substrate; annealing the first TMR film and the second TMR film in a magnetic field; and annealing the second TMR film a second time in a magnetic field. During the annealing of the second TMR film a second time, the first TMR film is not annealed. The magnetic field for the annealing the second TMR film a second time is less than the magnetic field for the annealing the first TMR film and the second TMR film. The annealing the second TMR film a second time is performed by laser annealing in a magnetic field. The laser annealing occurs with a laser beam size of less than 1 mm. During the annealing the second TMR film a second time in a magnetic field, the first TMR film is not masked.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By forming identical TMR films for all resistors, and then making the reference layers antiparallel for select TMR films, a Wheatstone bridge array can be fabricated in both a time sensitive and cost effective manner.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a first resistor comprising at least one first TMR film having a first reference layer, first pinned layer, and a first spacer layer, the first spacer layer sandwiched by and contacting both the first reference layer and the first pinned layer; and
   a second resistor electrically coupled to the first resistor, comprising at least one second TMR film having a second reference layer, second pinned layer, and a second spacer layer, the second spacer layer sandwiched by and contacting both the second reference layer and the second pinned layer, wherein the first TMR film and the second TMR film are substantially identical, wherein the first reference layer and the second reference layer have an antiparallel magnetic orientation, wherein the first pinned layer and the second pinned layer have a parallel magnetic orientation, and wherein the magnetic orientation of the second pinned layer is parallel to the magnetic orientation of the second reference layer.

2. The TMR sensor device of claim 1, further comprising:
a third resistor comprising at least one third TMR film having a third reference layer; and
a fourth resistor comprising at least one fourth TMR film having a fourth reference layer.

3. The TMR sensor device of claim 2, wherein the third TMR film and the fourth TMR film are substantially identical, and wherein the third reference layer and the fourth reference layer have an antiparallel magnetic orientation.

4. The TMR sensor device of claim 3, wherein the first TMR film, the second TMR film, the third TMR film, and the fourth TMR film are substantially identical.

5. The TMR sensor device of claim 4, wherein the first reference layer and the third reference layer have a parallel magnetic orientation, and wherein the second reference layer and the fourth reference layer have a parallel magnetic orientation.

6. The TMR sensor device of claim 1, wherein the first TMR film and the second TMR film each comprise:
a seed layer;
an antiferromagnetic layer disposed on the seed layer;
a pinned layer disposed on the antiferromagnetic layer, wherein the pinned layer is either the first pinned layer or the second pinned layer;
a spacer layer disposed on the pinned layer, wherein the spacer layer is either the first spacer layer or the second spacer layer;
a reference layer disposed on the spacer layer, wherein the reference layer is either the first reference layer or the second reference layer;
a barrier layer disposed on the reference layer; and
a free layer disposed on the barrier layer.

7. The TMR sensor device of claim 1, wherein the first TMR film has an R-H curve that has a positive slope and the second TMR film has an R-H curve that has a negative slope.

8. The TMR sensor device of claim 1, wherein the first resistor and the second resistor have the same resistance area (RA).

9. The TMR sensor device of claim 1, wherein the first TMR film further comprises a first antiferromagnetic layer disposed in contact with the first pinned layer, the first antiferromagnetic layer pinning the magnetic orientation of the first pinned layer.

10. The TMR sensor device of claim 1, wherein the magnetic orientation of the first pinned layer is antiparallel to the magnetic orientation of the first reference layer.

11. The TMR sensor device of claim 1, wherein the second TMR film further comprises a second antiferromagnetic layer disposed in contact with the second pinned layer, the second antiferromagnetic layer pinning the magnetic orientation of the second pinned layer.

12. The TMR sensor device of claim 1, wherein the first reference layer and the second reference layer each individually comprise a multilayer stack of materials.

13. A TMR sensor device, comprising:
four resistors electrically coupled to each other, wherein each resistor includes at least one tunnel magnetoresistive (TMR) film that includes a reference layer, pinned layer, and a spacer layer, the spacer layer sandwiched by and contacting both the reference layer and the pinned layer, wherein the TMR films are identical in each resistor, and wherein the reference layer of at least two TMR films has an antiparallel magnetic orientation and the pinned layer of the at least two TMR films has a parallel magnetic orientation, wherein the at least two TMR films have their magnetic orientation of their reference layers aligned parallel with respect to their respective pinned layers.

14. The TMR sensor device of claim 13, wherein each TMR film comprises:
a seed layer;
an antiferromagnetic layer disposed on the seed layer;
the pinned layer disposed on the antiferromagnetic layer;
the spacer layer disposed on the pinned layer;
the reference layer disposed on the spacer layer;
a barrier layer disposed on the reference layer; and
a free layer disposed on the barrier layer.

15. The TMR sensor device of claim 14, wherein the seed layer and the spacer layer comprise the same material.

16. The TMR sensor device of claim 15, wherein the seed layer and the spacer layer each comprise ruthenium.

17. The TMR sensor device of claim 13, wherein each resistor has the same number of TMR films.

18. The TMR sensor device of claim 13, wherein each resistor has the same resistance area (RA).

* * * * *